(12) United States Patent
Goldsby

(10) Patent No.: US 9,236,516 B2
(45) Date of Patent: Jan. 12, 2016

(54) SOLAR ENERGY COLLECTOR APPARATUS

(71) Applicant: Glenn M. Goldsby, Woodland Hills, CA (US)

(72) Inventor: Glenn M. Goldsby, Woodland Hills, CA (US)

(*) Notice: Subject to any disclaimer, the term of this patent is extended or adjusted under 35 U.S.C. 154(b) by 127 days.

(21) Appl. No.: 13/782,719

(22) Filed: Mar. 1, 2013

(65) Prior Publication Data

US 2014/0246075 A1    Sep. 4, 2014

(51) Int. Cl.
| | |
|---|---|
| H01L 31/054 | (2014.01) |
| H01L 31/042 | (2014.01) |
| H02S 20/32 | (2014.01) |
| H01L 31/052 | (2014.01) |
| H01L 31/0232 | (2014.01) |

(52) U.S. Cl.
CPC ........ *H01L 31/0547* (2014.12); *H01L 31/0521* (2013.01); *H02S 20/00* (2013.01); *H02S 20/32* (2014.12); *H01L 31/0232* (2013.01); *H01L 31/042* (2013.01); *Y02E 10/52* (2013.01)

(58) Field of Classification Search
CPC . Y02E 10/52; H01L 31/0522; H01L 31/0525; H01L 31/0232; H01L 31/042; H01L 31/0524
See application file for complete search history.

(56) References Cited

U.S. PATENT DOCUMENTS

| | | |
|---|---|---|
| 3,058,394 A | 10/1962 | Edlin |
| 3,125,091 A | 3/1964 | Sleeper, Jr. |
| 3,203,306 A | 8/1965 | Lefferts |
| 3,985,118 A | 10/1976 | Bard |
| 4,011,857 A | 3/1977 | Rice |
| 4,022,186 A | 5/1977 | Northrup, Jr. |
| 4,023,368 A * | 5/1977 | Kelly ............................ 60/698 |
| 4,069,812 A | 1/1978 | O'Neill |
| 4,089,323 A | 5/1978 | Trihey |
| 4,111,184 A | 9/1978 | Perkins |
| 4,116,223 A | 9/1978 | Vasllantone |
| 4,194,949 A | 3/1980 | Stark |
| 4,204,881 A | 5/1980 | McGrew |
| 4,211,211 A | 7/1980 | Toomey et al. |
| 4,230,094 A | 10/1980 | Szulmayer |
| 4,238,246 A | 12/1980 | Genequand et al. |
| 4,270,981 A | 6/1981 | Stark |
| 4,289,118 A | 9/1981 | Stark |
| 4,297,000 A | 10/1981 | Fries |
| 4,299,201 A | 11/1981 | Tsubota |
| 4,323,052 A | 4/1982 | Stark |
| 4,337,759 A | 7/1982 | Popovich et al. |
| 4,344,417 A | 8/1982 | Malecek |
| 4,347,834 A | 9/1982 | York |
| 4,352,350 A | 10/1982 | Johnson |

(Continued)

FOREIGN PATENT DOCUMENTS

GB    1570684    7/1980

OTHER PUBLICATIONS

International Search Report and Written Opinion from PCT/US2014/016681 dated Aug. 14, 2014, 8pp.

*Primary Examiner* — Marla D McConnell
(74) *Attorney, Agent, or Firm* — Banner & Witcoff, Ltd.

(57) ABSTRACT

A solar energy collector includes a generally tubular housing or multiple tubular housings each having an open end for receipt of solar rays which are then reflected from a generally conical mirror within the housing onto solar cells lining the inside surface of the housing. Various mechanisms are utilized to favorably orient the housing or otherwise direct the solar rays and to maximize the incidence of reflected solar rays onto solar cells.

8 Claims, 17 Drawing Sheets

(56) References Cited

U.S. PATENT DOCUMENTS

| | | |
|---|---|---|
| 4,385,430 A | 5/1983 | Bartels |
| 4,456,783 A | 6/1984 | Baker |
| 4,545,366 A | 10/1985 | O'Neill |
| 4,848,319 A | 7/1989 | Appeldom |
| 5,110,368 A * | 5/1992 | Otto et al. ............ 136/246 |
| 5,578,139 A | 11/1996 | Jones et al. |
| 7,875,793 B2 | 1/2011 | Hsiao et al. |
| 2002/0062856 A1 | 5/2002 | Wescott |
| 2002/0180404 A1 * | 12/2002 | Benn et al. ............ 320/101 |
| 2008/0053524 A1 | 3/2008 | Lehovec |
| 2010/0051016 A1 | 3/2010 | Ammar |
| 2010/0116317 A1 | 5/2010 | Ma |
| 2011/0192460 A1 | 8/2011 | Tan |
| 2012/0042949 A1 | 2/2012 | Shifman |

\* cited by examiner

A-A

B-B

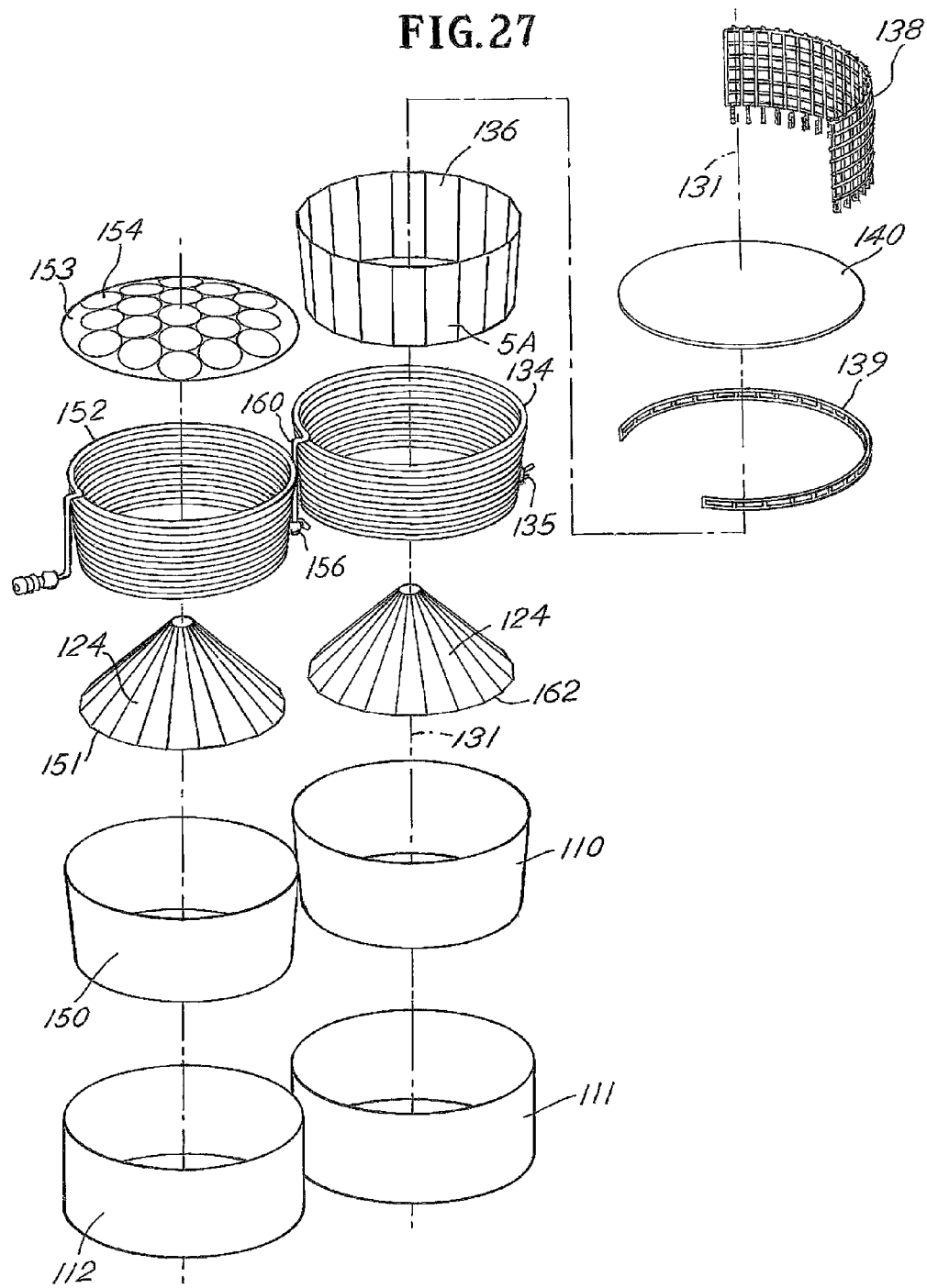

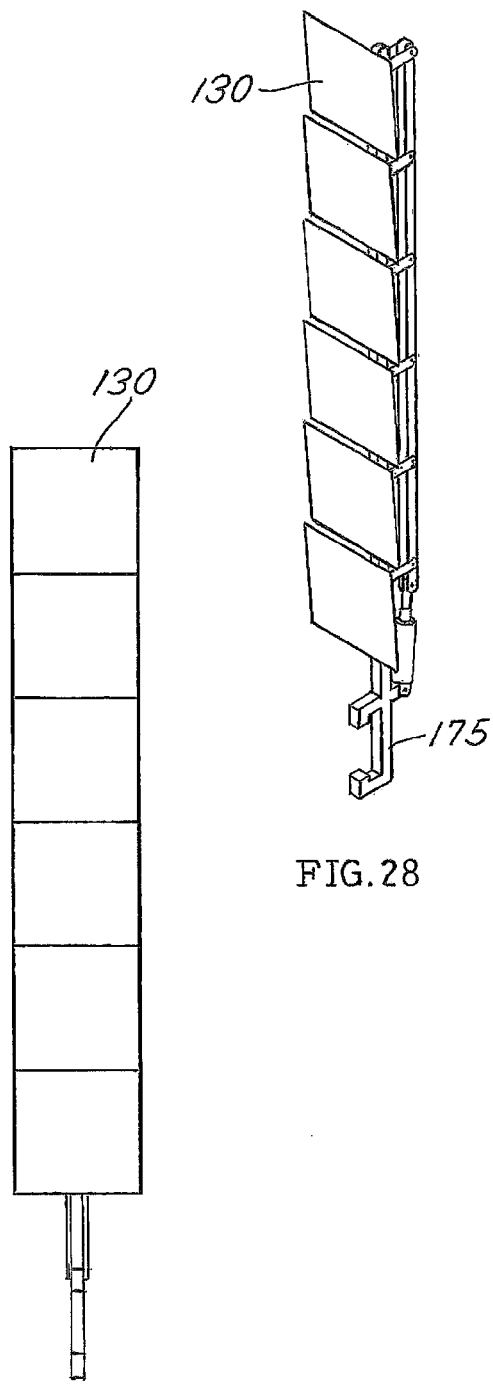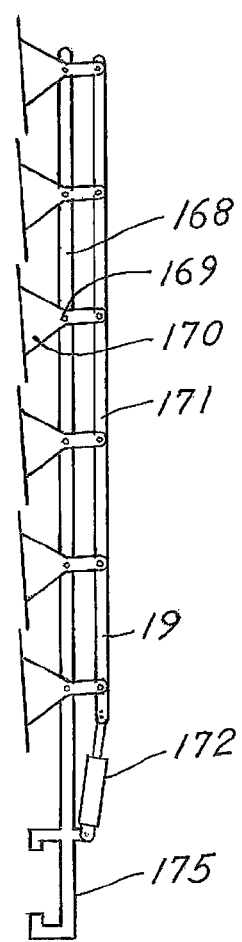
FIG. 29   FIG. 28   FIG. 30

DETAIL A

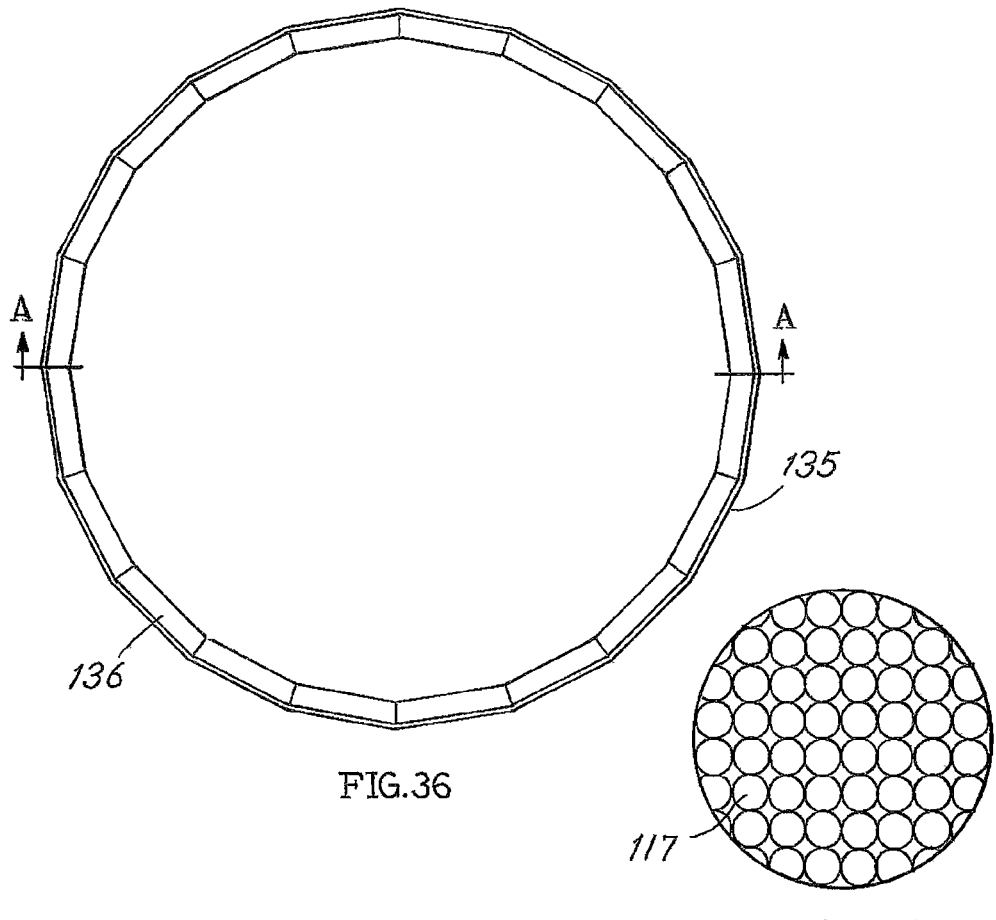
FIG.36
DETAIL A
FIG. 38
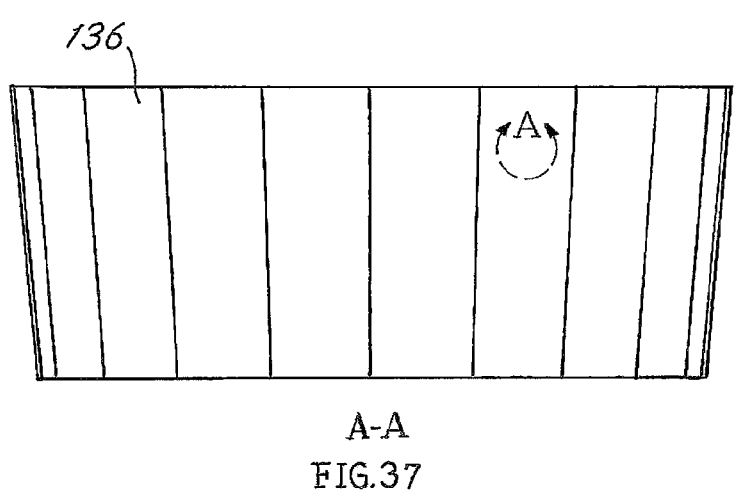
A-A
FIG.37

SOLAR ENERGY COLLECTOR APPARATUS

BACKGROUND OF THE INVENTION

In a principal aspect the present invention relates to a solar energy collector and a solar power system which utilizes an array of solar cells to generate electric energy from a light source.

The use of solar panels to generate electricity is the subject of much research, development and public investment seeking to create efficient, cost effective "green energy". Multiple systems have been proposed or built which utilize arrays of flat, solar cell panels oriented with respect to the sun including systems such as exemplified by various patents and patent applications:

| U.S. Pat. No./ Application No. | Title | Issue Date/ Publication Date |
|---|---|---|
| 3,058,394 | Reflector for Solar Heaters | Oct. 16, 1962 |
| 3,125,091 | Inflatable Solar Energy Collector | Mar. 17, 1964 |
| 3,203,306 | Optical Ray Concentrator | Aug. 31, 1965 |
| 3,985,118 | Solar Furnace | Oct. 12, 1976 |
| 4,011,857 | Solar Energy Converter and Elongated Fresnel Lens Element | Mar. 15, 1977 |
| 4,022,186 | Compound Lens Solar Energy System | May 10, 1977 |
| 4,069,812 | Solar Concentrator and Energy Collection System | Jan. 24, 1978 |
| 4,089,323 | Solar Tracking Device | May 16, 1978 |
| 4,111,184 | Sun Tracking Solar Energy Collector | Sep. 5, 1978 |
| 4,116,223 | Solar Energy Unit | Sep. 26, 1978 |
| 4,194,949 | Solar Distillation Apparatus | Mar. 25, 1980 |
| 4,204,881 | Solar Power System | May 27, 1980 |
| 4,211,211 | Solar Energy Collector and Transfer Apparatus | Jul. 8, 1980 |
| 4,230,094 | Solar Concentrator | Oct. 28, 1980 |
| 4,238,246 | Solar Energy System with Composite Concentrating Lenses | Dec. 9, 1980 |
| 4,270,981 | Solar Distillation Apparatus | Jun. 2, 1981 |
| 4,289,118 | Solar Energy System with Pivoting Lens and Collector and Conduit System Therefor | Sep. 15, 1981 |
| 4,297,000 | Solar Lighting System | Oct. 27, 1981 |
| 4,299,201 | Solar Energy Focusing Means | Nov. 10, 1981 |
| 4,323,052 | Solar Energy System | Apr. 6, 1982 |
| 4,337,759 | Radiant Energy Concentration by Optical Total Internal Reflection | Jul. 6, 1982 |
| 4,344,417 | Solar Energy Collector | Aug. 17, 1982 |
| 4,347,834 | Variable Entropy Solar Energy Harvester | Sep. 7, 1982 |
| 4,352,350 | Means for Tracking The Sun | Oct. 5, 1982 |
| 4,385,430 | Method of Forming an Energy Concentrator | May 31, 1983 |
| 4,456,783 | Multielement Optical Panel | Jun. 26, 1984 |
| 4,545,366 | Bi-Focussed Solar Energy Concentrator | Oct. 8, 1985 |
| 4,848,319 | Refracting Solar Energy Concentrator and Thin Flexible Fresnel Lens | Jul. 18, 1989 |
| 5,578,139 | Stowable and Deployable Solar Energy Concentrator with Fresnel Lenses | Nov. 26, 1996 |
| 7,875,793 | Solar Cell Assembly | Jan. 25, 2011 |
| 2008/0053524 A1 | Solar Cell Panel Integrated with a Conforming Array of Miniature Lenses | Mar. 6, 2008 |
| 2010/0051016 A1 | Modular Fresnel Solar Energy Collection System | Mar. 4, 2010 |
| 2010/0116317 A1 | Inter-Facing Solar Panels | May 13, 2010 |

Prior art proposals involve a variety of solar cell materials, various constructions of solar panels, different arrays of the solar cell panels, various types of lenses and designs to concentrate a solar light source, including the use of Fresnel lenses, light guide assemblies and the like. Despite the abundance of prior art and the various mechanisms and approaches suggested to enhance the ability to convert solar energy into heat or electrical energy in an efficient and cost effective manner and in a manner which can be scaled upward and implemented for the generation of significant amounts of power or which can be adapted to lesser power needs, there remains a need for an inexpensive, yet efficient solar cell assembly for energy generation including generation of electric energy.

SUMMARY OF THE INVENTION

Briefly the present invention comprises a solar energy collector assembly which includes a generally tubular member having a generally centerline axis, an open top end to receive light, a peripheral inner wall and a bottom support panel or bracket. The peripheral inner wall includes an array of discrete solar cells mounted on the inside wall face having a light receiving surface facing the interior of the tubular member. The bottom support bracket engages and positions a generally conical member within the tubular member. The conical member is positioned with a broad support base or lower end within the tubular member and a narrower apex upper end disposed near the top end of the tubular member. The conical member includes at least a partially reflective outer surface. The outer surface may also include or incorporate a reflective solar cell assembly. Solar radiation directed into the tubular member is reflected onto the solar cells lining the inner wall of the tubular member by reflection from the surface at the conical member. The tubular member is mounted on an adjustable mounting assembly which enables the tubular member to be appropriately oriented with respect to a solar light source. A current collection circuit is connected to discrete solar cells located on the inside wall of the tubular member.

An array of tubular collector assemblies may be mounted on a support frame and may each be discretely orientable or aligned in accord with a programmed alignment protocol. Alternatively or in addition, the array may be oriented in unison by adjustment of the support frame in at least two degrees and preferably three degrees of orientation.

Described embodiments provide that the tubular member as well as the internal conical member are generally symmetric about a common centerline axis. The solar cells on the inside wall face of the tubular member and/or on the conical member are coupled with current measurement apparatus which measure the source and quantity of current associated with one or more of the cells comprising the array of solar cells to facilitate alignment of the various collector support assemblies in an efficient manner by moving the solar energy collector assembly in response to sensing of the measured current from the various solar cells.

Because the solar energy collector assembly comprises an elongate tube with a generally centerline axis, the surface area within the tube exaggerates or effectively enhances the area susceptible to impingement by light rays relative to the area of a plane transverse to the tube axis thus making the tubes highly efficient collectors relative to flat panels. This feature coupled with the feature associated with the orientation of the collector tube or tubes, which is programmed in response to measurement of current generation by the solar cells, further enhances the ability to efficiently generate solar sourced energy. Because the energy collector tubular assemblies each comprise a unit for solar energy collection, and are generally modular, the number, size and their arrangement either as an individual unit or in various arrays may be easily adjusted to enhance the collection of solar energy. Moreover, because the units are generally modular, any failure of a single unit enables easy replacement thereof on a framework of multiple units thus enhancing the serviceability of such an array.

Various additional features may be incorporated with the tubular units. That is, the configuration of the tube as well as the conical or other shaped reflective insert may be adjusted to account for geographical and other factors. The top of the unit may be covered with a clear or translucent panel to concentrate the solar light source and to protect the interior of the tube member from dust, debris and the like. The panel or top cover may include or comprise one or more lens to concentrate solar light. Because each of the units may be susceptible to individual orientation, the efficiency of an array of such units may be enhanced by orientation controls.

An array of such assemblies may be positioned on a building such as a parking structure. The electricity generated by such an array may be linked to electric vehicle charge stations, for example, located in the parking structure. Such an assembly may be fabricated in multiple sizes. For example, such an assembly may comprise a large silo or multiple silos.

In sum, the tubular solar power design places the solar cells inside a generally cylindrical tower positioned generally flat against the inside walls of the tower. The top is typically covered with a clear cover to keep the cells from collecting dust and debris. The inside on the tower or cylinder incorporates a mirrored cone or reflector coaxially positioned in the tower or tube that redirects the light onto the solar cells that line the inside walls of the tubular member. The tubular member or cylinders or towers may be mounted on gimbals on a main frame to allow them to pivot towards and follow the sun. The main mounting frame may also move to point the open end of the cylinders toward the sun when the sun is lower in the sky. This allows the cylinders to be mounted closely together. This system may incorporate tracking systems to follow sun movement throughout the day and year.

Thus it is an object, feature and aspect of the invention to provide an improved means for collecting solar energy.

A further object, aspect and feature of the invention is to provide a solar energy collector which may be comprised of multiple modular units of tube member collectors with a shaped interior reflective member that diverts solar energy to multiple solar cells mounted on the interior wall of the tube.

Another object, aspect and feature of the invention is to provide a solar cell assembly which can be oriented in a highly efficient manner.

Yet a further object, aspect and feature of the invention is to provide a solar energy collector design capable of utilizing various units of various sizes on a frame to collectively generate solar sourced energy in a highly efficient and cost effective manner.

These and other objects, advantages, aspects and features of the invention are set forth in the detailed description which follows.

BRIEF DESCRIPTION OF THE DRAWING

In the detailed description which follows reference will be made to the following Figures:

FIG. 27 is an exploded isometric view of the embodiment of FIG. 20;

FIG. 28 is a perspective view of a mirror assembly for reflecting solar rays in the embodiment of FIG. 20;

FIG. 29 is a front elevation of the mirror reflector assembly of FIG. 28;

FIG. 30 is a side elevation of the mirror reflector assembly of FIG. 29;

FIG. 36 is a top plan view of an array of solar panels incorporated in the embodiment of FIG. 20 and FIG. 27;

FIG. 37 is a sectional view taken along the line A-A of FIG. 36; and

FIG. 38 is a detail of a section A of a solar panel in the array of FIG. 37.

DETAILED DESCRIPTION OF EMBODIMENTS OF THE INVENTION

Figure 19:
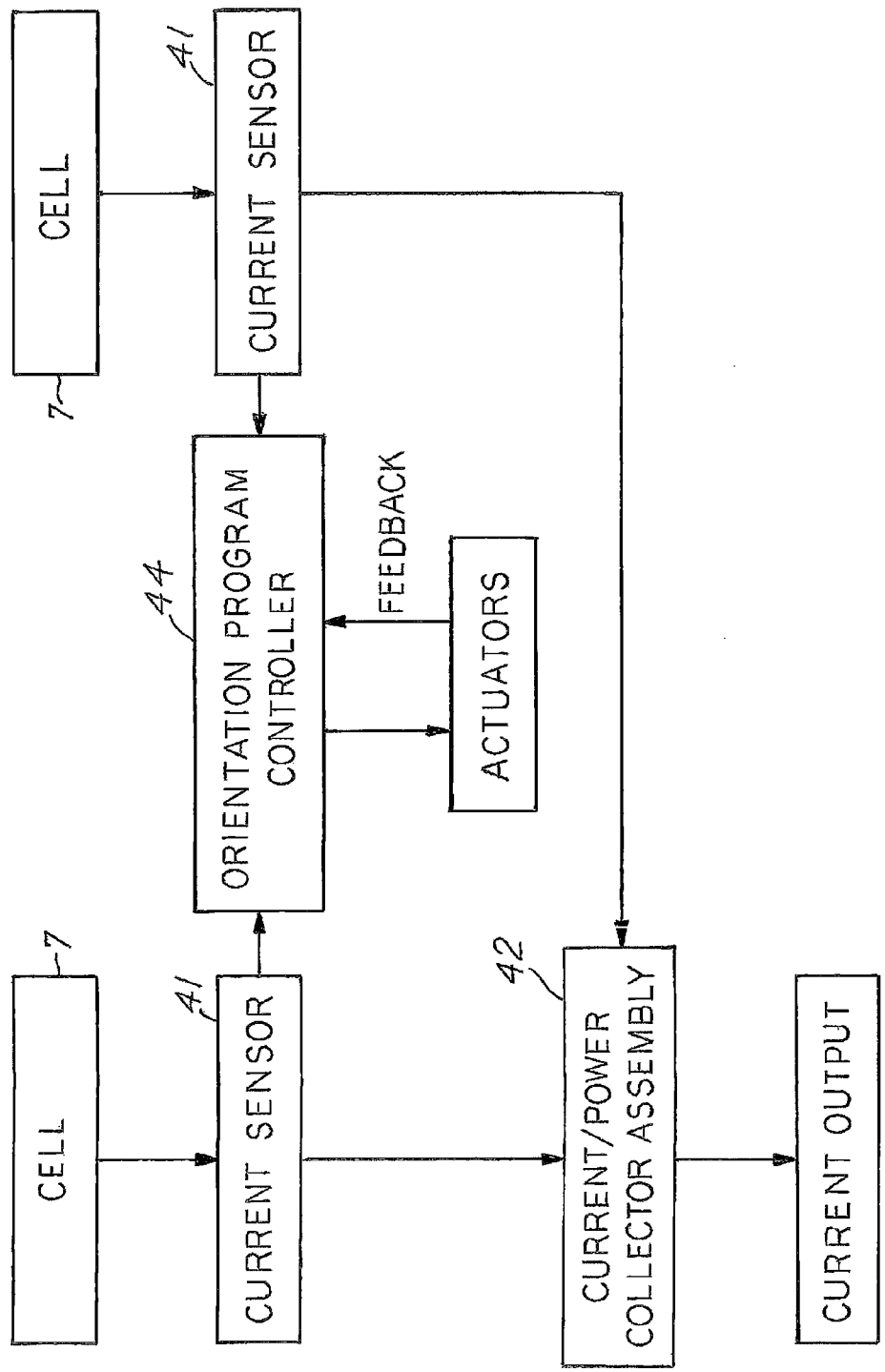
FIG. 19 is a flow diagram for a control system of an embodiment of the invention.
Figure 20:
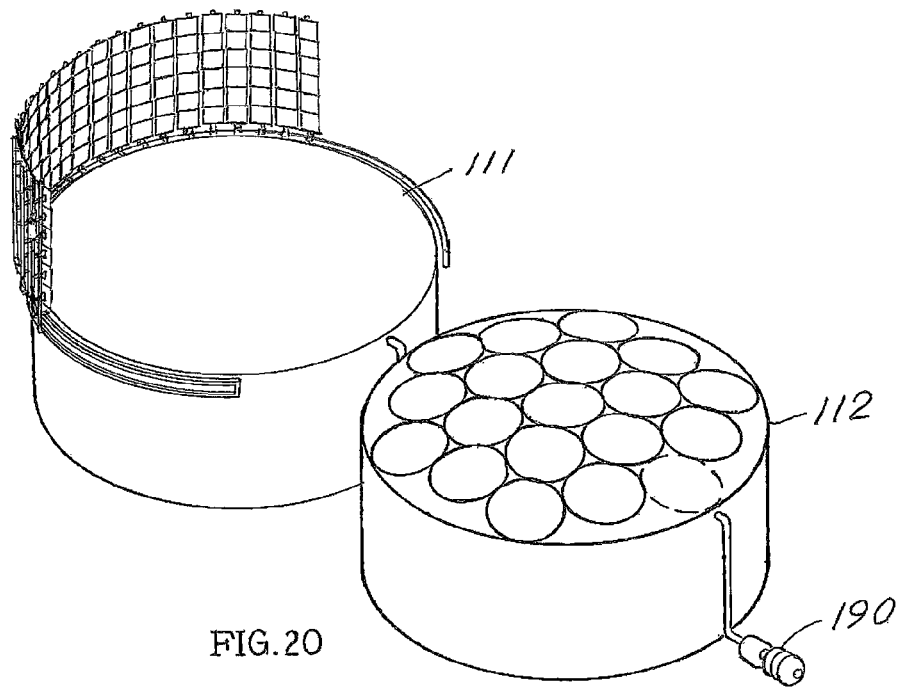
FIG. 20 is an isometric view of an alternative embodiment of the invention comprised of first and second interconnected solar towers or silos.
Figure 21:
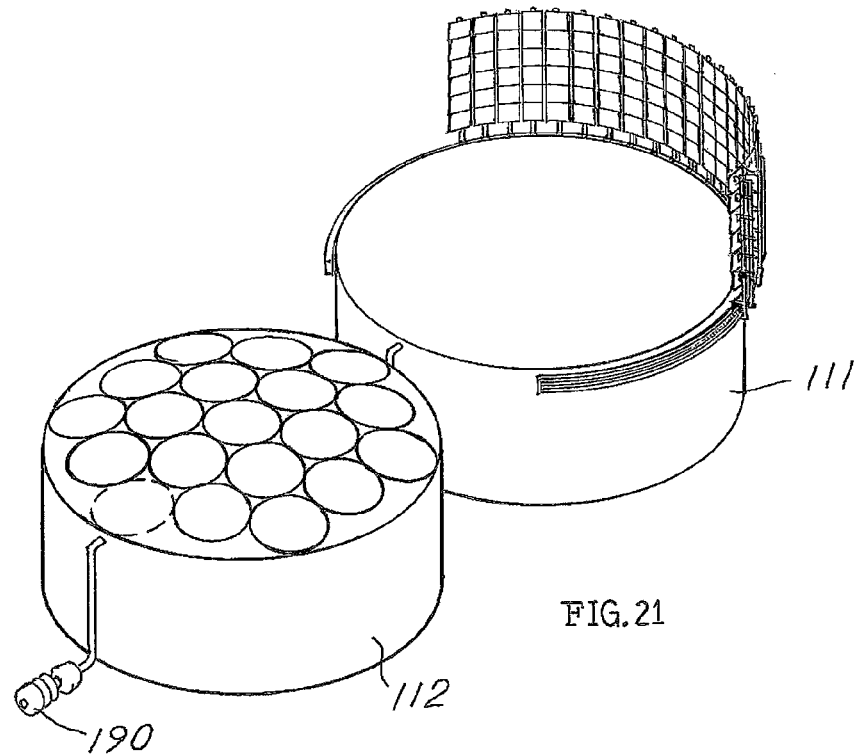
FIG. 21 is an isometric view of the embodiment of FIG. 20 as viewed from the opposite side of the depiction of FIG. 20.
Figure 22:
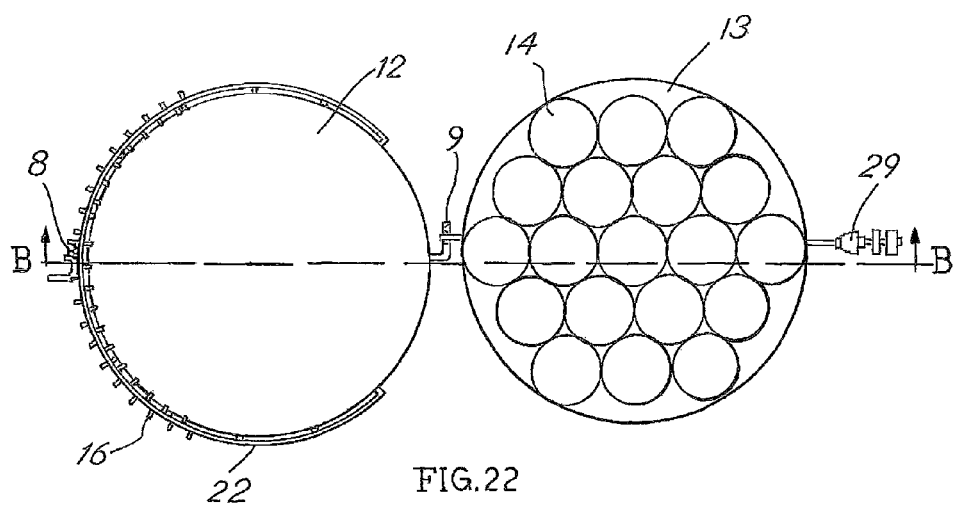
FIG. 22 is a top plan view of the embodiment of FIG. 20.
Figure 26:
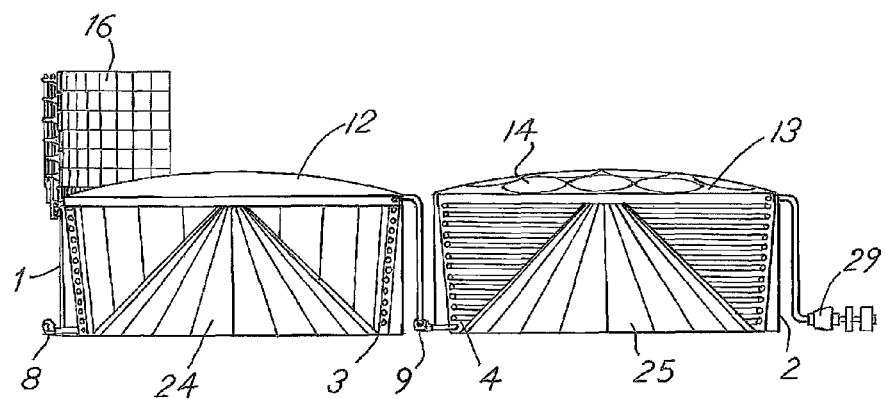
FIG. 26 is a sectional view of the embodiment of FIG. 22 taken along the line B-B in FIG. 22.
Figure 23:
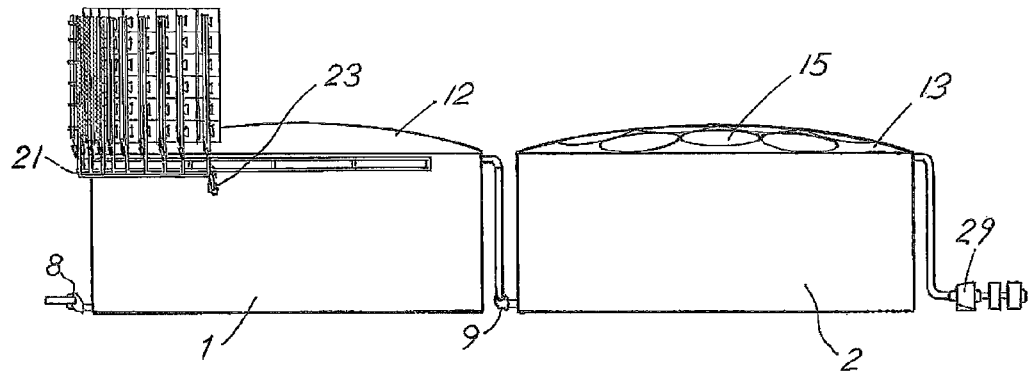
FIG. 23 is a side elevation of the embodiment of FIG. 20.
Figure 24:
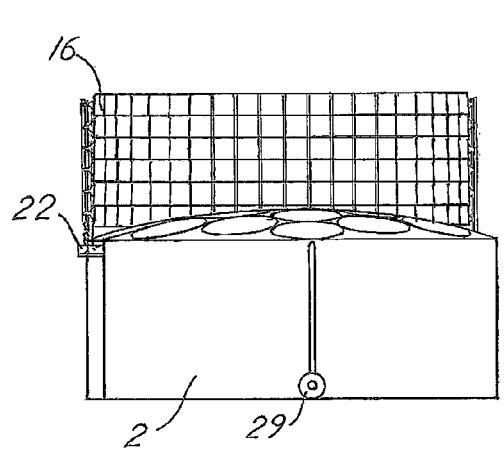
FIG. 24 is an end elevation of the embodiment of FIG. 20 viewed from the right hand view of FIG. 20.
Figure 25:
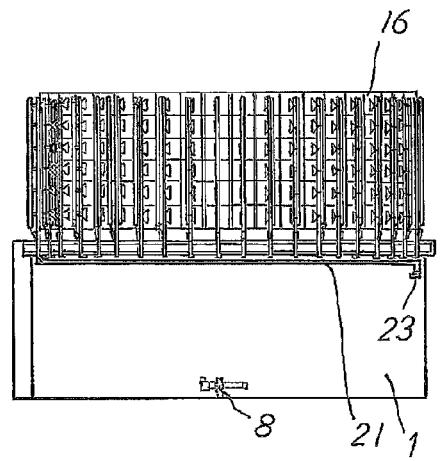
FIG. 25 is an end elevation opposite the end elevation of FIG. 24.

FIGS. 1-8 depict a combination of elements which illustrate aspects of the invention including generally tubular configured solar collectors arranged on a support frame in an array that maximizes the exposure of multiple solar cells to incident light. FIGS. 9-18 illustrate in greater detail the generally tubular solar collectors. FIG. 19 is a flow diagram illustrating an arrangement of various control elements for control of mechanical orientation devices which align the solar collectors either individually or collectively in an efficient orientation for collection of solar or light energy. FIGS. 20-38 depict an embodiment of the invention incorporated in a large size power station.

Solar Collector Arrays

FIGS. 1-9 depict a rectangular frame base 12 connected by hinges 15 to a congruently sized middle frame assembly 13 which, in turn, is attached to a congruently sized support frame 14 by connecting hinges 15. The frames 12 and 13 may be pivoted about their hinges 15 by linear actuators 1. Similar linear actuators 1 pivot the outer frame or tower support frame 14 about their hinges 15 relative to the middle frame or frame member 13. In the embodiment depicted the frames or frame members 12, 13 and 14 are generally rectangular and include cross members and other reinforcing elements 2, 3, 4 to support a plurality of solar collectors in the form of generally tubular members 18.

The solar collectors or tubular members 18 as described hereinafter are arrayed and supported upon the tower frame or outer frame member 14 in any one of multiple arrays or arrangements. In the embodiment depicted, the solar collectors 18 are arranged or arrayed in parallel rows. Each solar collector 18 comprises a multiplicity of solar cells as described hereinafter which, in combination, generate electric current. The solar collectors or tubular members 18 in the embodiment shown are mounted on a separate base frame 23 each supported on the tower or support frame 14. This is also depicted for example in FIGS. 17 and 18.

Figure 17:
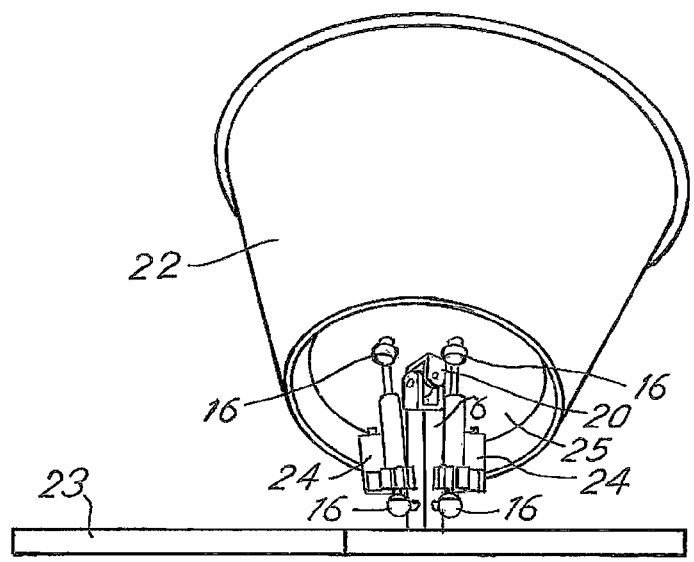
FIG. 17 is a side elevation of the solar collector depicted in FIG. 14.
Figure 18:
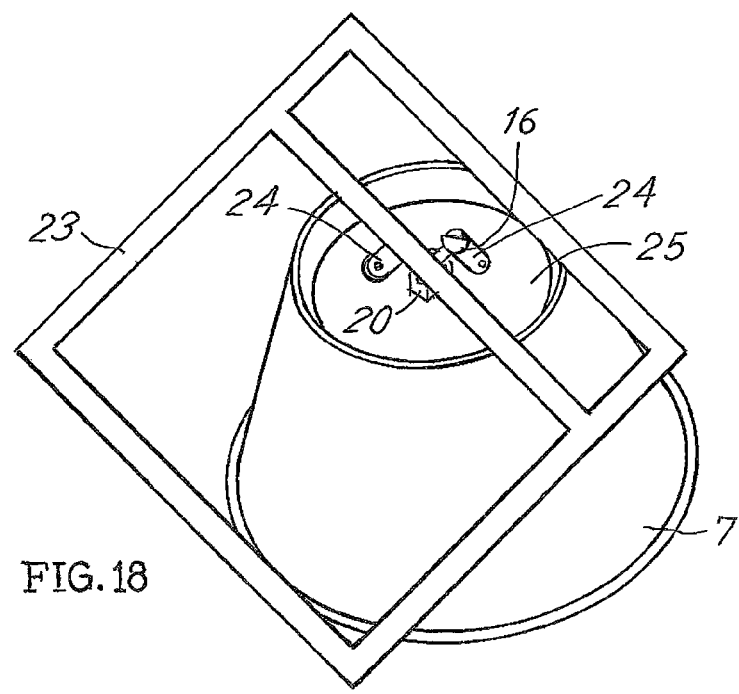
FIG. 18 is a bottom plan view of the solar energy collector assembly of FIG. 17.

As depicted in FIG. 17, a solar collector 18 mounted on the base frame 23 is movable in at least two degrees of freedom inasmuch as it is attached to the frame 23 by a gimbal support arm 6 with a universal joint 20 affixed to the solar collector 18 and, more particularly, to the bottom panel 25 of the solar collector 18 namely, the plate 25. Linear actuators 24 are connected to the support arm 6 by means of a ball joint 16. Actuators 24 include an extendable rod connected through ball joint 16 to the plate 25 thus providing a means to orient the collector 18 in response to the control signals provided to the actuators 24. As a result of the described construction, the solar collectors 18 may also be oriented by means of adjusting the orientation of the middle frame 13 and outer or tower frame 14 as well as adjusting the individual solar collectors by means of the actuators 24. A benefit of the construction of the invention is that an individual collector support base frame 23 for a single solar collector 18 may be easily removed from engagement with and support on the outer or tower frame 14 in the event of failure of the operational function of the particular solar collector 18. Further, all of the support members or frame elements 13, 14, 15 may be oriented to maximize the incidence of solar rays into the collector units 18.

FIGS. 10-13 illustrate in greater detail the construction of the solar collectors 18. The solar collector 18 includes a tubular member 22 which, in the embodiment depicted, is generally frusto-conical though this is not considered to be a limitation of the invention. The utilization of a generally tubular member 22 is an aspect of the invention, however. The tubular member 22 typically includes a transparent cover 10 which provides protection from debris and weather. The tubular member 22 is a hollow tubular member and includes a generally centerline axis 40. A bottom panel or base 25 of the tubular member 22 exhibits a lesser dimension than the outer top or open end of the tubular member 22.

Figure 1:
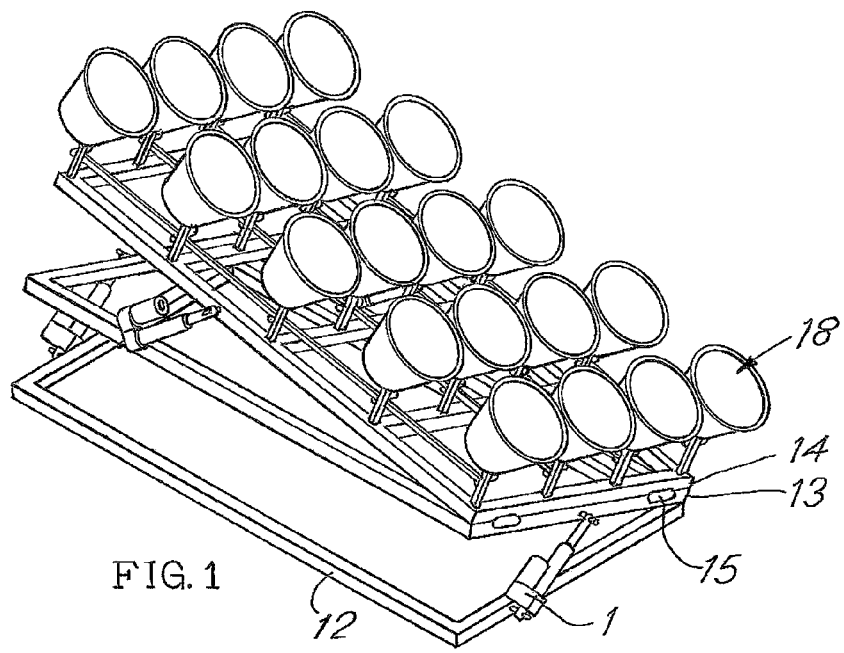
FIG. 1 is an isometric view of an array of an embodiment of solar energy collector assemblies on a support framework depicting the means for orienting the array.
Figure 2:
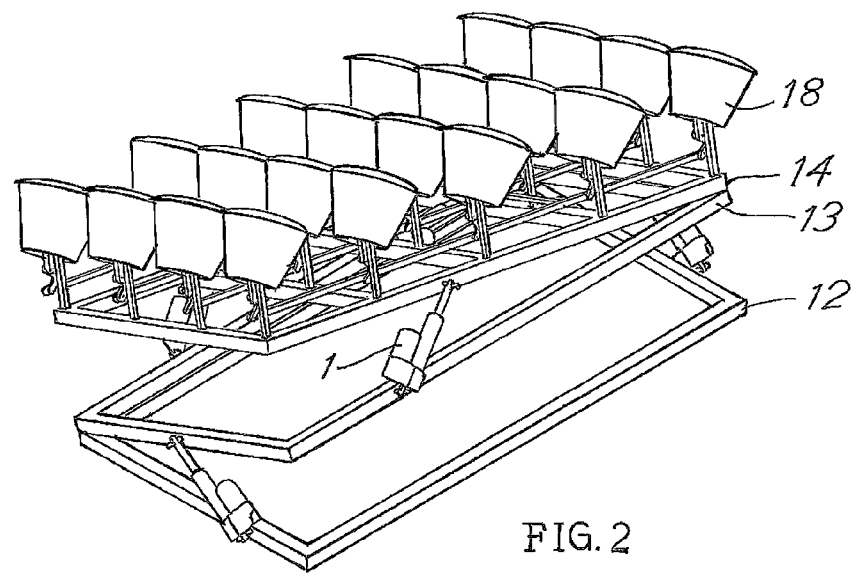
FIG. 2 is a further isometric view of the array of FIG. 1.
Figure 3:
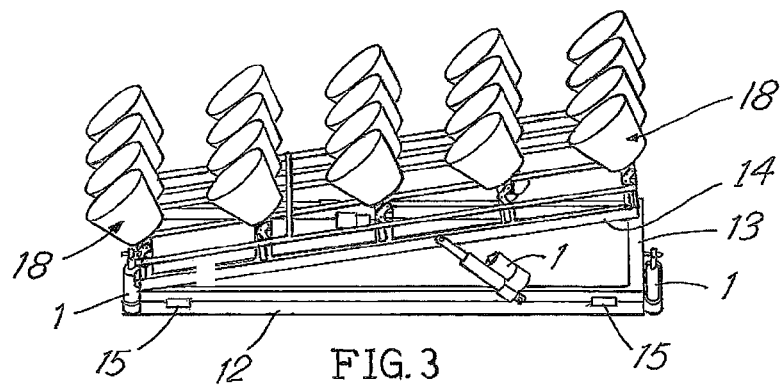
FIGS. 3-6 are further views of the array of FIGS. 1 and 2.
Figure 4:
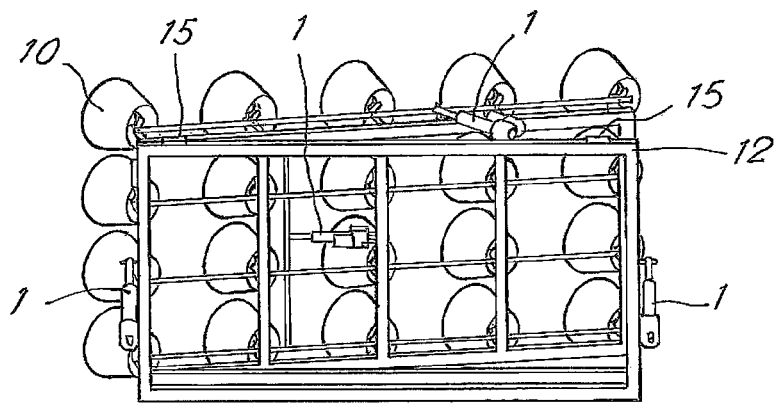
Figure 5:
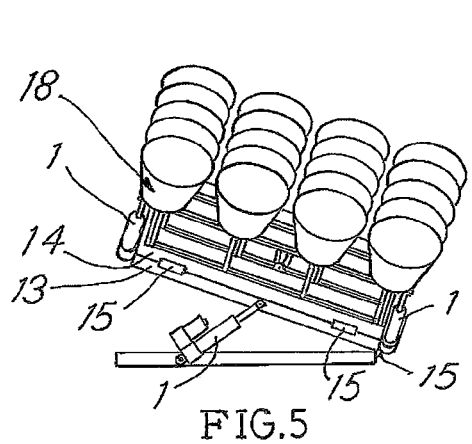
Figure 6:
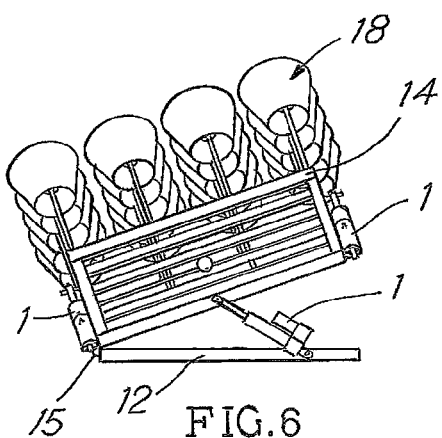
Figure 7:
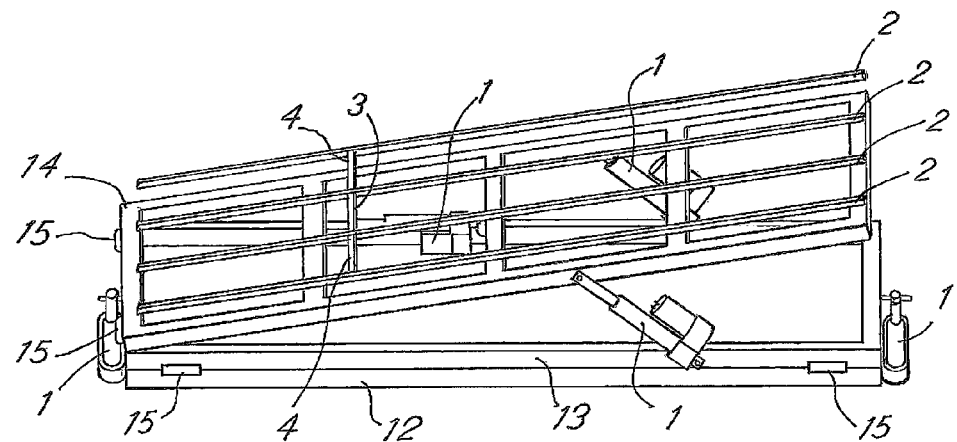
FIG. 7 is an isometric view of a frame which supports the array solar energy collectors depicted in FIGS. 1 and 2.
Figure 8:
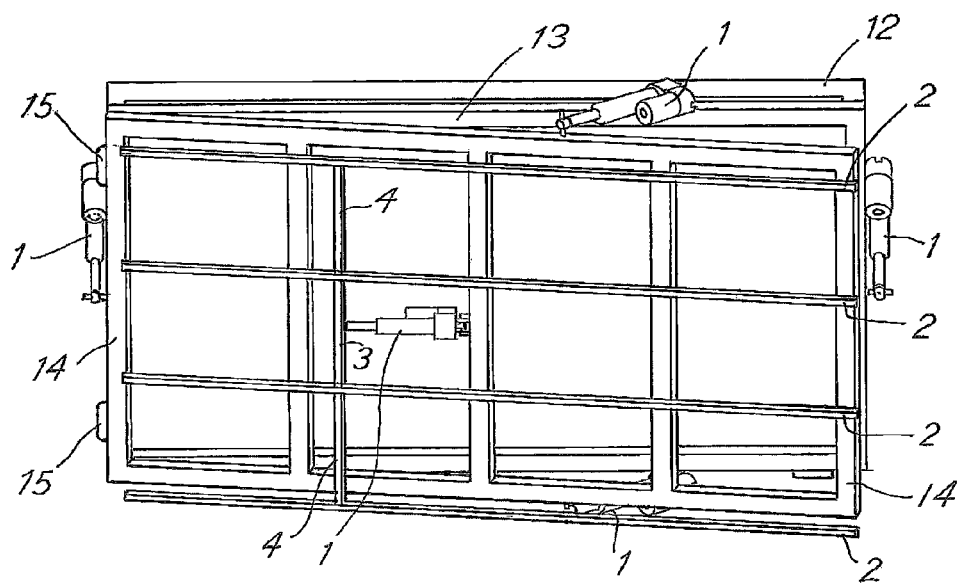
FIG. 8 is a top plan view of the frame of FIG. 7.
Figure 9:
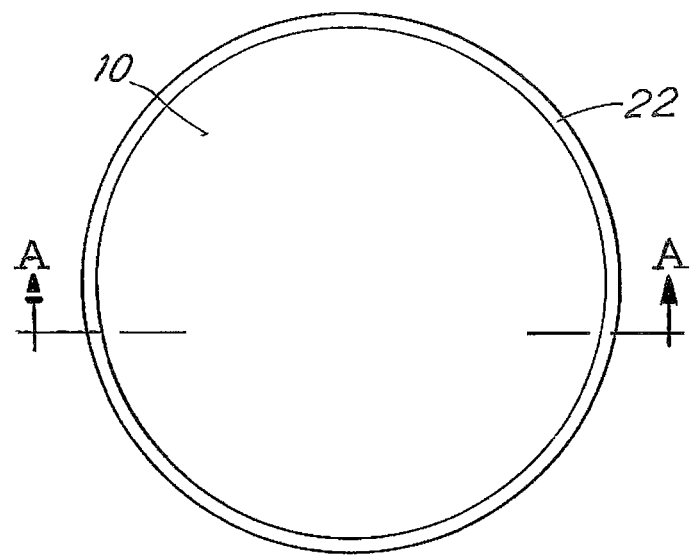
FIG. 9 is a top plan view of an individual solar energy collector assembly of the type that is incorporated in the array of FIGS. 1 and 2.
Figure 10:
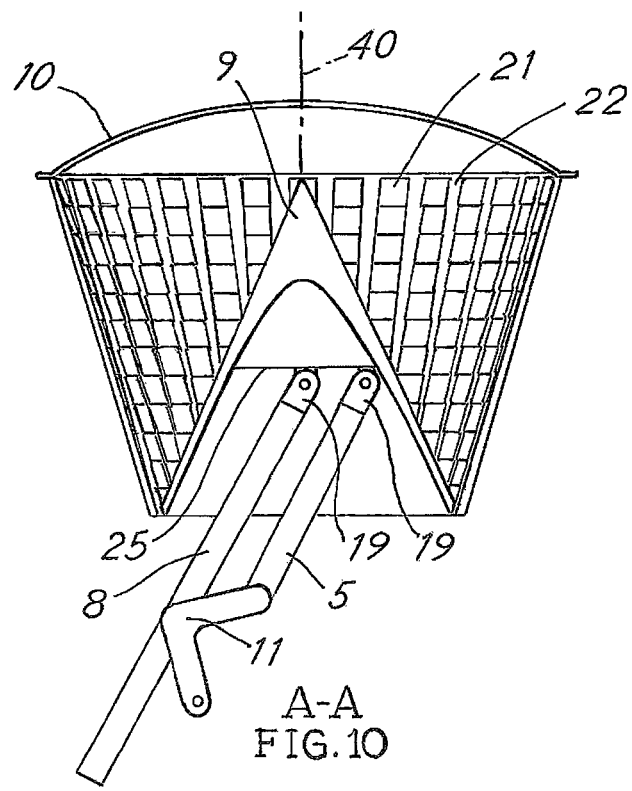
FIG. 10 is a cross sectional view of the assembly of FIG. 9 taken along the line A-A.

Positioned within the tubular member 22 is a generally conically configured reflector 9. In other words, the reflector 9 includes a reflective outer surface designed to reflect solar or light rays at an angle of reflection substantially equal to the angle of incidence. FIG. 10 illustrates a further method of orienting the tubular member 22 and thus the collector 18 in two degrees of orientation. That is, control or actuator arms 5 and 8 are hinged to the interior of the cone 9 and attached thereto by a fastener assembly 19. Crank 11 is pivotally connected to the arms 5 and 8 and may be actuated to orient the tubular member 22.

Figure 11:
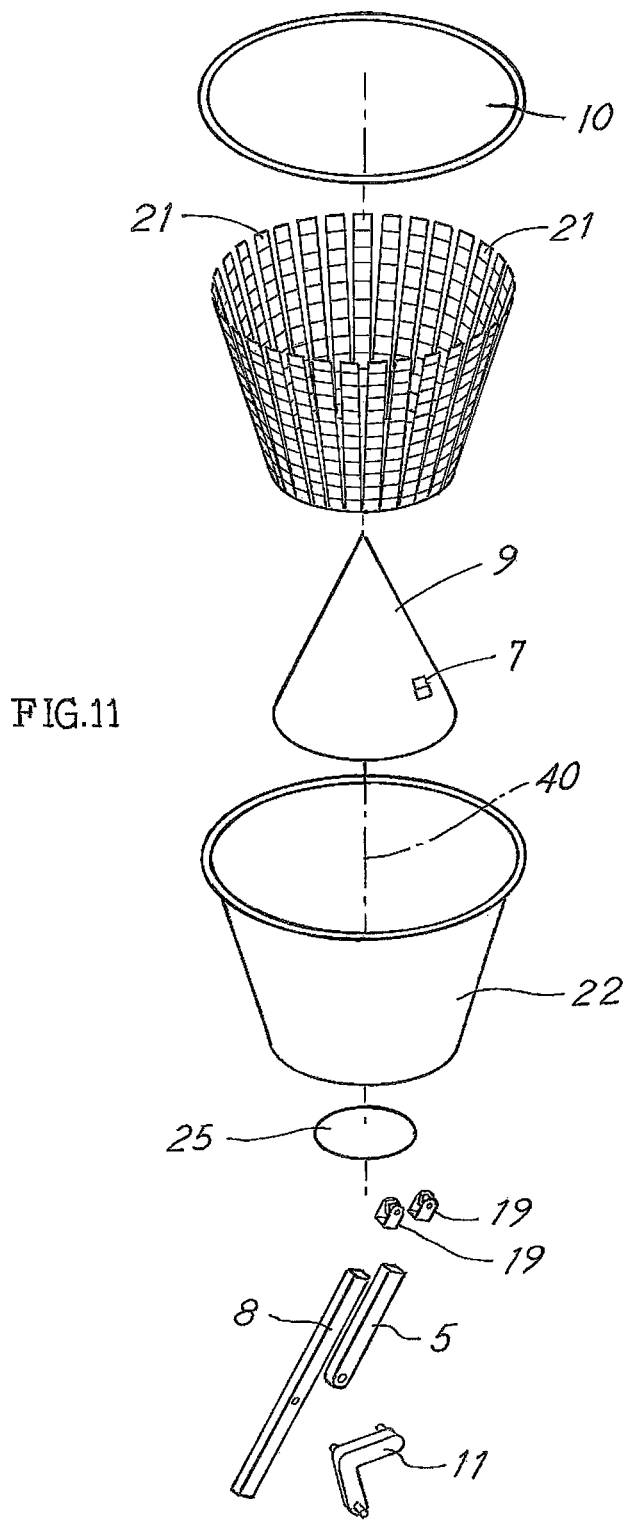
FIG. 11 is an exploded isometric view of the component parts of the collector assembly of FIG. 9.
Figure 12:
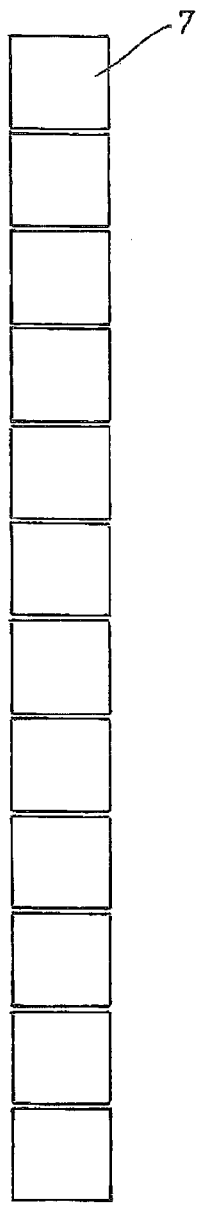
FIG. 12 is a plan view of solar cells incorporated in the collector assembly of FIG. 9 and as depicted in FIG. 11.
Figure 13:
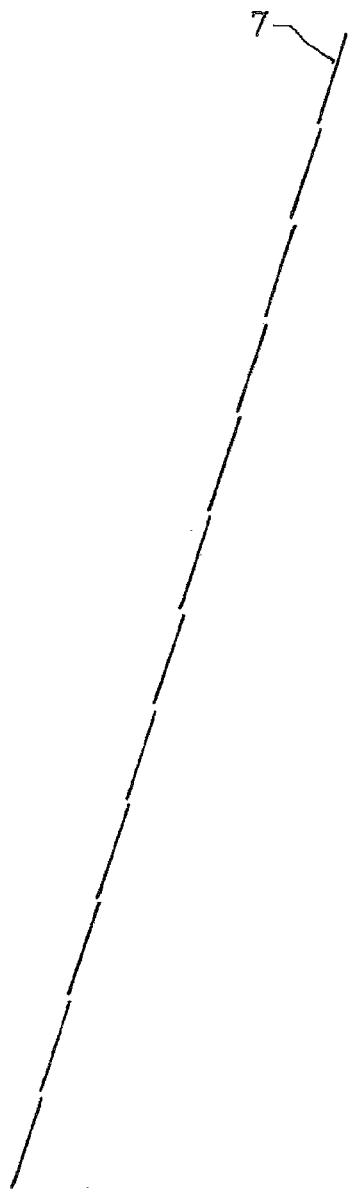
FIG. 13 is a side view of the solar cells of FIG. 12.
Figure 14:
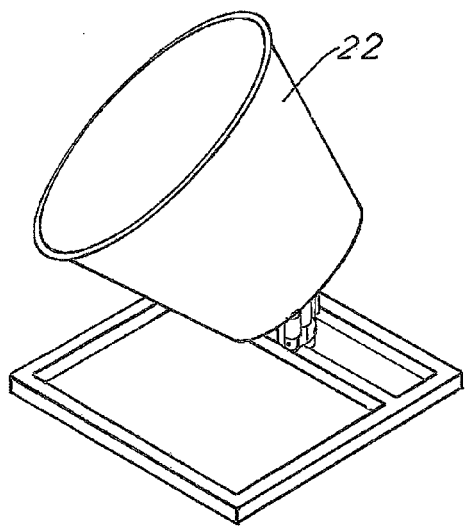
FIG. 14 is an isometric view of a single collector assembly mounted on a frame.
Figure 15:
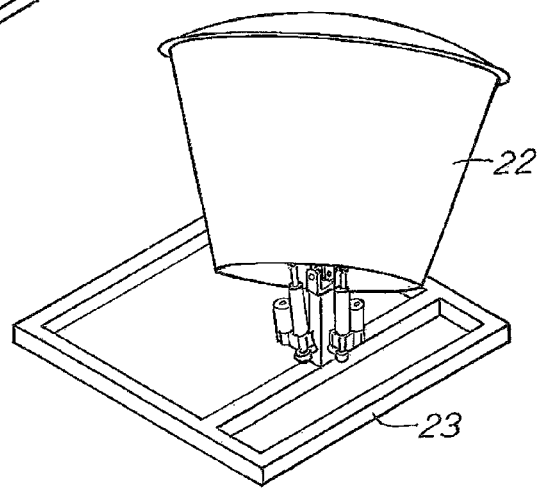
FIGS. 15 and 16 are further isometric views of the collector assembly of FIG. 14.
Figure 16:
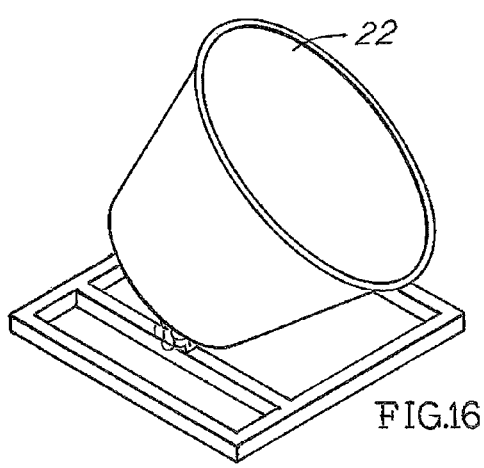

The inner surface of the tubular member 22 includes a plurality or array of solar cells 21 mounted thereon that are arrayed, by way of example, in the manner depicted in FIGS. 11, 12 and 13. The solar cell 21 cell array is thus fastened to or mounted on the interior surface of the tubular member 22 in a manner which will align individual cells 21 to appropriately intersect light reflected from the surface of the conical reflector 9. Solar cells 21 may be arrayed within the interior of the tubular member 22 in rows which encircle the conical member reflector 9. Light which shines through the cover 10 is thus reflected and directed to appropriate cells 21. As an alternative additional feature of the invention the conical member 9 itself may comprise a solar cell or cells 7 with an outer reflective surface so that the light impinging thereon will also reflect, but will simultaneously generate current thereby enhancing the energy resulting from the use of the device by generating current through solar cells 7 affixed to or incorporated with the conical member 9 as well as that which is reflected to the individual solar cells 21 in an array mounted in tubular member 22.

The array of the solar cells 21 may be adjusted in combination and individually to maximize the generation of an electrical current by means of such cells 21. The cells 21 may have a flat surface. Alternatively, they may have a concave surface. For example, if the conical member 9 includes an array of cells 7 that also act as reflectors that array of cells 7 may be convexly or parabolically configured or otherwise curved to focus solar light energy on cells 21 mounted on the interior surface of the tubular member 22. As a consequence, multiple arrays of distinct solar cell designs may be incorporated on conical member 9 as well as within tubular member 22. The solar cells 7 may also be arranged in a manner which will enhance their efficiency. Thus, rather than using large panel collectors, multiple smaller solar cells 7, 21 may be incorporated in a design of the type described and as a result should any of the solar cells 7, 21 fail for one reason or the other, the remaining cells 7, 21 will continue to function. Further, individual cells 7, 21 may easily be replaced within the tubular member 22 or conical member 9 to effect repair or replacement or upgrading thereof. Thus, the design of the device provides enhanced benefits in manufacture and maintenance of a solar energy collector which in addition may occupy space more efficiently.

The conical member 9 may have a variety of designs. The divergent angle of the conical member and thus the angle of light incidence of the member 9 may be varied. This may enable variability of the configuration of the solar collector tubular member 22. The cone 9 may be frusto conical with an angle of divergence at the apex generally in the range of 45° to 105°. The orientation of the axis 40 of the tubular member 22 may be accommodated by the design of the cone 9 as well as the orientation of the various solar cells 7, 21 within tubular member 22 as illustrated, for example, in FIGS. 21 and 22. The angle of divergence may vary relative to the location on the circumference of the conical member 22. Accordingly, the interior or configuration of the tubular member 22 may be varied.

Another feature of the invention is illustrated in FIG. 19. Thus, one or more cells 21, 7 may be interconnected in series or parallel to provide current to a power collector assembly 42. The connection with the power collector assembly 42 may include a current sensor 41 for some individual or multiple set of cells 7, 21. The current sensor 41 signals may be directed to a program controller 44 which is programmed to control the orientation of one or more solar collectors 18 as well as individual cells 7, 21, arrays of cells, and/or other variable aspects of the assembly. The controller 44 may be thus programmed to match the sensed current magnitude of various sensors 41 and thereby maximize orientation of the assembly of collectors 18 automatically using a feedback circuit. For example, the actuators 1, 11, 24 associated with the solar collectors 18 can be individually maximized by the orientation program controller 44 which operates the actuators 1, 11, 24. Current output can be maximized using the sensors 41 associated with one or more of the collector cells 7, 21 within the tubular member 18 thereby enabling the tubular members 18 collectively or individually to be oriented about an axis 40 in the most efficient manner. For example, sample cells 7, 21 could be chosen at spaced intervals vertically along the axis 40 as well as radially around the axis 40 to control the orientation of the solar collector 18 in a most efficient manner. In any event, the output of one or more cells 7 and/or 21 can provide information utilized to control the orientation of one or more tubular or members 18 as well as solar cells 21 within a tubular member 22 or cells 7 mounted on a conical member.

Solar Power Plant Embodiment

FIGS. 20-38 illustrate an embodiment of the invention comprising an electric power generation plant. FIGS. 20-27 illustrate the overall design of a power plant embodiment. FIGS. 28-38 illustrate various aspects of the elements comprising a power plant embodiment.

Referring to the FIGS. 20-38, a power plant embodiment is comprised of a first generally cylindrical silo 111 coupled to a second generally cylindrical silo 112. In practice, each silo 111 and 112 may be comprised of multiple components which may be prefabricated as sections of the silo 111 or 112 or alternatively cast in place or assembled in place at a site. An example of a silo construction in terms of size and general construction is a grain silo. The size in terms of the diameter of such a silo is considered to be a convenient and useful size for the purpose of generating electricity using solar energy. Typically such silos are designed with electrical service connections, have excellent structural integrity and require minimal alteration for conversion from a grain storage unit into a solar energy electric generator station.

Figure 31:
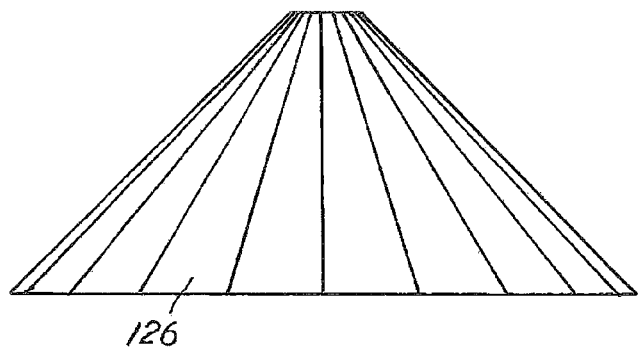
FIG. 31 is a side elevation of an array of reflectors which are mounted to form a frusto conical element of the embodiment of FIG. 20.

In a typical embodiment, a pair of silos 111 and 112 is arranged in tandem as depicted in the Figures. The first silo 111, as depicted in FIG. 31, includes an internal layer of insulation 110. Also mounted within the silo 111 is a conical reflector or cone array 124. The reflector array 124 is comprised of a series of generally triangular reflector panels 152 that are joined to form cone array 124 concentrically arrayed about a vertical centerline axis 131 with the apex of the cone projecting upwardly and outwardly from the silo 111. The cone 124 has a vertical height substantially equal to the vertical height of at least a portion of the silo 111. The cone 124 is mounted on an internal track (not shown) and may be rotated about its vertical axis 131.

Positioned against the inner layer of insulation 110 lining the silo 111 is a tubular heat exchanger 134. The tubular heat exchanger 134 is designed for the passage of water therethrough in response to a circulating pump 135. Concentrically positioned over the tubular heat exchanger 134 is a solar panel array 135A. The solar panel array 135A includes a series of solar cells positioned on separate vertical panels 136 arrayed concentrically around medial axis 131 of the assembly associated with the first silo 111.

Along the top periphery of the silo 111 is a circular track 137. The track 137 is designed to support a partial or semi-cylindrical mirror array 138 to enable the mirror array 138 to move about the axis 131. Positioned over the top of the silo 111 is a protective dome 140. The dome 140 is transparent thereby permitting solar rays to shine through dome 140 and be directed or reflected by means of the reflective mirror array or mirrors 138 onto the panels 152 of the cone array 124. The solar rays then incident, focus and reflect upon the interior panels 136 which comprise solar cell arrays 136A. Electricity is thereby generated by solar cells comprising the solar cell arrays 136A and is collected to provide electric power to operate the assembly with excess electrical power collected for distribution.

Second silo 112 is likewise comprised of a cylindrical array of silo forming materials which may be prefabricated or cast in place or otherwise formed. Positioned within the silo 112 is a layer of insulation 150. Positioned within the cylindrical layer of insulation 150 and mounted on an appropriately engineered track is a conical reflector 151 substantially of the same construction as the reflector array 124 associated with silo 111. Further, a tubular heat exchanger 152 is positioned in the silo 112 within this circumference of the insulation 150. Positioned over the silo 112 and over the described components is a dome 153 which is in the form of a Fresnel lens or lens array 154. It is to be noted that the heated water in the heat exchanger 134 of silo 111 is connected by an appropriate conduit 160 to heat exchanger 152. To the extent necessary, pump elements such as pumps 135 and 156 may be utilized to pump fluids such as water and/or steam through the heat exchangers 134, 152 as the water may be converted to steam. Other materials may be circulated through the system for heat exchange.

FIGS. 29, 30 and 31 illustrate in greater detail the structure of component parts of the mirror array 138. These components comprise a plurality of mirrors 166 mounted on a support bracket 168. The mirrors 166 are mounted so they can be tilted or pivoted about an axis 169 which connects a mirror support yoke 170 to an actuating bar 171. The bar operates in response to an actuator 172. In this manner, the mirrors 166 may be oriented properly to direct and reflect the solar arrays that impinge or shine thereon downwardly to the conical reflector 124. The support bracket 168 is affixed to track 139 by means of the clamp array 175. In this manner, the array of mirrors 138 may be moved along the track 139 to properly orient the mirrors 138 in the direction of solar rays. The solar rays may then be reflected by the mirrors 138 to shine against the reflective conical member or array 124 and against the solar cells or the solar cell panels 136. The water or fluid within the heat exchanger 134 will cool the solar cells comprising panel 136 and that heated water may then be pumped to the heat exchanger 152 associated with the second silo 112.

Figure 32:
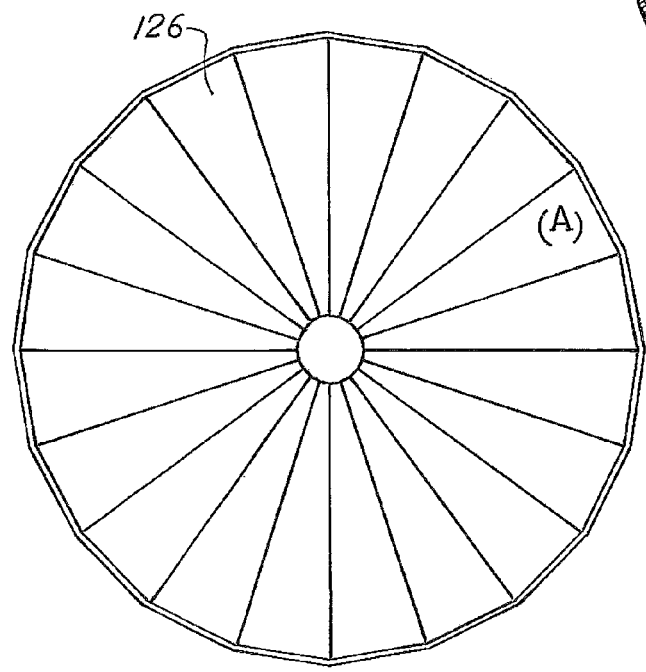
FIG. 32 is a top plan view of the reflector array of FIG. 31.
Figure 33:
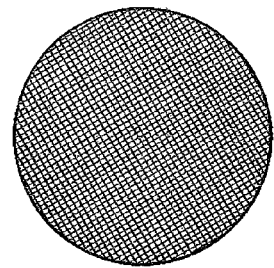
FIG. 33 is a detail of the reflecting surface of the reflector panels of the array of FIG. 32.
Figure 34:
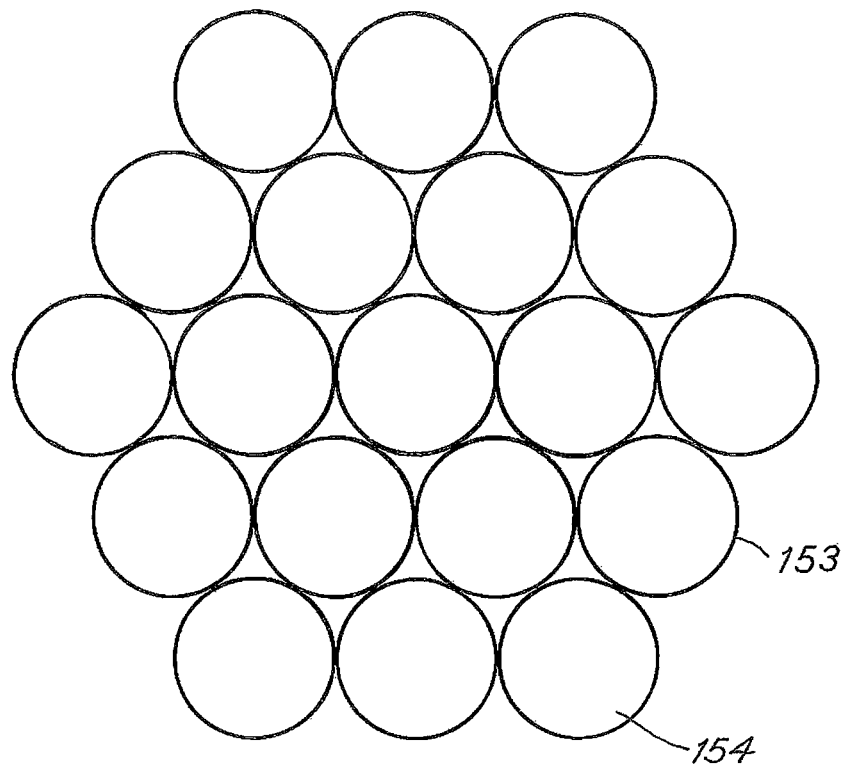
FIG. 34 is a top plan view of an array of Fresnel lens incorporated in the top cover of the embodiment of FIG. 20.
Figure 35:
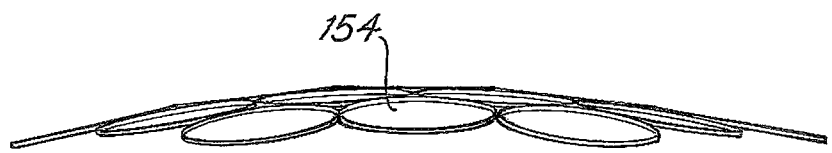
FIG. 35 is a side elevation of the Fresnel lens array of FIG. 34.

FIGS. 31, 32 and 33 illustrate in greater detail the construction of the conical reflectors 124 and 151. The reflectors are comprised of generally truncated triangular sectors or panels 126. FIG. 37 provides detail of the reflector panels 126. That is, the reflector panels 126 may be comprised of multiple solar cells in an array or alternatively multiple segmented reflective surfaces.

A further feature of the construction is associated with the secondary silo 112. FIGS. 38 and 39 depict the arrangement. That is, a Fresnel lens array 154 is comprised of a series of Fresnel lens which are focused on the various conical reflectors or conical reflection arrays or surfaces 126. The reflective solar rays are then directed to the heat exchanger 152 thereby heating the fluid such as water. In certain instances the heat is adequate to convert the water to steam. The steam is then directed through a turbo generator 190. This provides yet another source of electricity generated by the assembly.

FIGS. 34-38 depict further details with respect to the structure of the solar cell panels 136. The solar cell panels 136 of the solar cell array 135 are positioned in an array which is designed to receive reflected solar rays and generate electricity. The panels 136 thus comprise a series of solar cells 117 in an appropriate geometric pattern on the surface of a panel 136. Those solar cells 117 are connected to a generator to operate the powered components of the system with the excess electricity directed to an appropriate grid.

In operation, electricity is generated by means of the first silo or power assembly 111 utilizing the concept of the tubular solar energy collectors wherein reflected light is directed to solar cells lining the interior of the generally cylindrical tower but also wherein heat generated from the solar cells is collected to heat water pumped through heat exchangers surrounding the array of solar cell panels 126. An accompanying tower or silo 112 utilizes multiple Fresnel lens to focus and direct solar energy or light against the surface of conical reflector 151 that, in turn, directs the solar rays to a heat exchanger 152 to thereby superheat or convert the water pumped from the first silo or tower assembly 111 into steam or superheated liquid or water. That superheated liquid or water can then be used to operate a generator 190.

A projected calculation indicates an array of the type described incorporated in silos 111 and 112 having a solar cell surface area of 11,864 square feet and a heat exchange surface area of 11,895 square feet will require 9,640 watts of power to operate pumps, orientation motors and controls and will provide a gross power output of 97,140 watts. Assuming the silos 111 and 112 have diameters of about 30 feet and a height of about 25 feet, the gross land or surface area occupied by towers of such dimensions will be about 7,100 square feet which is about one third of the land or surface space required by a flat panel array. Of course, variables such as efficiency of panels vis-a-vis cells, control efficiencies and dimensional factors will impact upon any such comparison. However, preliminary investigation strongly indicates a much more efficient use of land space for the described invention relative to flat panel arrays.

Multiple variations of the aspects and features of the invention are possible and are considered to be within the scope of the invention. For example, the size, shape, arrangement and number of solar cells may be varied. The number and configuration of the tubular members may be varied. The array, size and dimensions of the tubular members may be varied. The utilization of different types of solar cells within the tubular member which are attached or affixed to the reflecting conical surface and the inside surface or wall of the tubular member may be varied. The tubular member solar energy collectors may be combined with other energy source collection devices such as wind generators mounted on the silos or tubes, and heat collection devices such as those described. As a consequence, the invention is to be limited only by the following claims and equivalents thereof.

What is claimed is:

1. A solar energy collector assembly comprising:
a plurality of solar collectors, each solar collector comprising:
a tubular member having an open top, an interior inner peripheral, frusto-conical wall with a centerline axis, and a bottom support, said inner wall having a narrow end, said inner wall including a plurality of discrete solar cells mounted circumferentially within the tubular member on said inner wall in an array, each of said inner wall solar cells comprising a light receiving surface facing the interior of the tubular member;
a conical member supported on the bottom support, said conical member having a conical member centerline axis coaxial with said inner wall centerline axis and including a broad support end mounted on said bottom support, a narrow outer end and an outer face, said conical member outer face having a reflective outer surface for reflection of light onto the solar cells' light receiving surfaces, said tubular member inner wall converging toward said conical member broad end, said conical member outer face and said tubular member inner wall symmetrical about said axes for reflection of incident rays from the outer face of said conical member onto said solar cells' light receiving surfaces;
the solar energy collector assembly further comprising an adjustable mounting assembly for orienting the plurality of solar collectors;
said adjustable mounting assembly comprising a lower rectangular base frame connected by hinges to a congruently sized middle frame, which, in turn, is connected to a congruently sized support frame, upon which the solar collectors are mounted; each of the frames are pivoted about the hinges by linear actuators, such that the linear actuators pivot the middle frame relative to the lower frame and pivot the support frame relative to the middle frame.

2. The assembly of claim 1 wherein said conical member is generally frusto-conical.

3. The assembly of claim 1 including a transparent cover over at least a part of said top.

4. The assembly of claim 1 wherein an angle of divergence of the generally conical member is in the range of about 45° to 105°.

5. The assembly of claim 1 further including a current collection device for current collection from said solar cells.

6. The assembly of claim 1 including a mounting control mechanism for displacing the collector assembly to orient the centerline axisaxes.

7. The combination of claim 1 wherein solar cells on said tubular member inner wall are reflective.

8. The combination of claim 1 further including an array of reflective solar cells on the conical member outer surface.

* * * * *